(12) United States Patent
Datta et al.

(10) Patent No.: US 7,355,254 B2
(45) Date of Patent: Apr. 8, 2008

(54) PINNING LAYER FOR LOW RESISTIVITY N-TYPE SOURCE DRAIN OHMIC CONTACTS

(75) Inventors: Suman Datta, Beaverton, OR (US); Jack T. Kavalieros, Portland, OR (US); Robert S. Chau, Beaverton, OR (US); Mark L. Doczy, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/480,667

(22) Filed: Jun. 30, 2006

(65) Prior Publication Data

US 2008/0017891 A1 Jan. 24, 2008

(51) Int. Cl.
*H01L 29/76* (2006.01)
*H01L 21/8238* (2006.01)

(52) U.S. Cl. .............................. 257/382; 257/E29.145; 438/233; 438/586; 438/607

(58) Field of Classification Search ................ 257/382, 257/384, 757, 768, E29.145; 438/233, 300, 438/586, 604, 607
See application file for complete search history.

(56) References Cited

U.S. PATENT DOCUMENTS

| | | | |
|---|---|---|---|
| 6,043,143 A * | 3/2000 | Shiralagi ................ 438/602 |
| 6,130,123 A | 10/2000 | Liang et al. | |
| 6,949,482 B2 * | 9/2005 | Murthy et al. ........... 438/739 |
| 7,084,423 B2 * | 8/2006 | Grupp et al. ............. 257/30 |
| 7,211,839 B2 * | 5/2007 | Kachi et al. ............ 257/194 |
| 2005/0104137 A1 * | 5/2005 | Faulkner et al. ......... 257/407 |
| 2006/0145271 A1 * | 7/2006 | Ichimori et al. ......... 257/384 |
| 2006/0186484 A1 * | 8/2006 | Chau et al. ............. 257/401 |
| 2006/0273347 A1 * | 12/2006 | Hikita et al. ............ 257/192 |
| 2007/0077739 A1 * | 4/2007 | Weber et al. ............ 438/528 |

* cited by examiner

*Primary Examiner*—Zandra V. Smith
*Assistant Examiner*—Toniae M Thomas
(74) *Attorney, Agent, or Firm*—Blakely, Sokoloff, Taylor & Zafman LLP

(57) ABSTRACT

A system or apparatus including an N-type transistor structure including a gate electrode formed on a substrate and source and drain regions formed in the substrate; a contact to the source region; and a pinning layer disposed between the source region and the first contact and defining an interface between the pinning layer and the source region, wherein the pinning layer has donor-type surface states in a conduction band. A method including forming a transistor structure including a gate electrode on a substrate and source and drain regions formed in the substrate; depositing a pinning layer having donor-type surface states on the source and drain regions such that an interface is defined between the pinning layer and the respective one of the source and drain regions; and forming a first contact to the source region and a second contact to the drain region.

18 Claims, 4 Drawing Sheets

PINNING LAYER FOR LOW RESISTIVITY N-TYPE SOURCE DRAIN OHMIC CONTACTS

FIELD

Integrated circuit devices.

BACKGROUND

Typical integrated circuit device goals are to increase integrated circuit performance and to increase transistor density (i.e., transistors per unit area) at minimum circuit power. To minimize power, many integrated circuits are made in the complementary insulated gate field effect transistor (FET) technology known as complementary metal oxide semiconductor (CMOS). A typical CMOS circuit includes paired complementary devices, i.e., an n-type FET (NFET) paired with a corresponding p-type FET (PFET), usually gated by the same signal. A CMOS inverter, for example, is a PFET and NFET pair that are series connected between a power supply voltage and ground (GND), and both gated by the same input signal. Since the pair of devices have operating characteristics that are, essentially, opposite each other, when one device (e.g., the NFET) is on and conducting, the other device (the PFET) is off, not conducting and, vice versa. The switch is open, i.e., the device is off, when the magnitude of the gate to source voltage ($V_{gs}$) is less than that of some threshold voltage ($V_T$). So, ideally, an NFET is off when its $V_{gs}$ is below $V_T$, and the NFET is on and conducting current above $V_T$. Similarly, a PFET is off when its gate voltage, $V_{gs}$, is above its $V_T$, i.e., less negative, and on below $V_T$.

Typically, to increase transistor density, the transistor channel is scaled along with the gate pitch which tends to increase the parasitic series resistance in devices due to the decreasing contact size and the scaled implanted junction depths. Series resistance may be represented by various components, one of which is the silicide to doped silicon interface resistance referred to as interface resistance, $R_{INT}$, where a source and drain junction region contain a silicide. $R_{INT}$ will continue to effect the total transistor resistance particularly for NFETs or NMOS devices and will tend to get worse with continued scaling due to the fixed barrier height from Fermi level pinning at the silicide-silicon interface in the middle of the silicon bandgap.

BRIEF DESCRIPTION OF THE DRAWINGS

Features, aspects, and advantages of embodiments will become more thoroughly apparent from the following detailed description, appended claims, and accompanying drawings in which:

DETAILED DESCRIPTION

In a common transistor device formation, a silicide layer may be placed in a source junction region and a drain junction region by introducing a metal such as cobalt or nickel on a surface of a semiconductor substrate above the source junction region and the drain junction region and annealing the structure to form the silicide. One problem with a silicide is that the silicide tends to pin a Fermi level in the middle of the silicon energy band gap. Such pinning at the silicide junction region interface tends to result in a higher effective barrier height, regardless of the work function of the metal selected for the silicide. The effective barrier height effects the interface resistance at the silicide junction region interface.

As transistor density continues to increase, a gate pitch continues to shrink which results in a reduction of the contact area. This results in a dramatic increase in the parasitic series resistance of transistors, particularly NMOS transistors, which degrades device performance. A significant contributor to the parasitic series resistance is the interface resistance, $R_{INT}$, between the metal silicide and the n+ doped junction region of a transistor.

Figure 1:
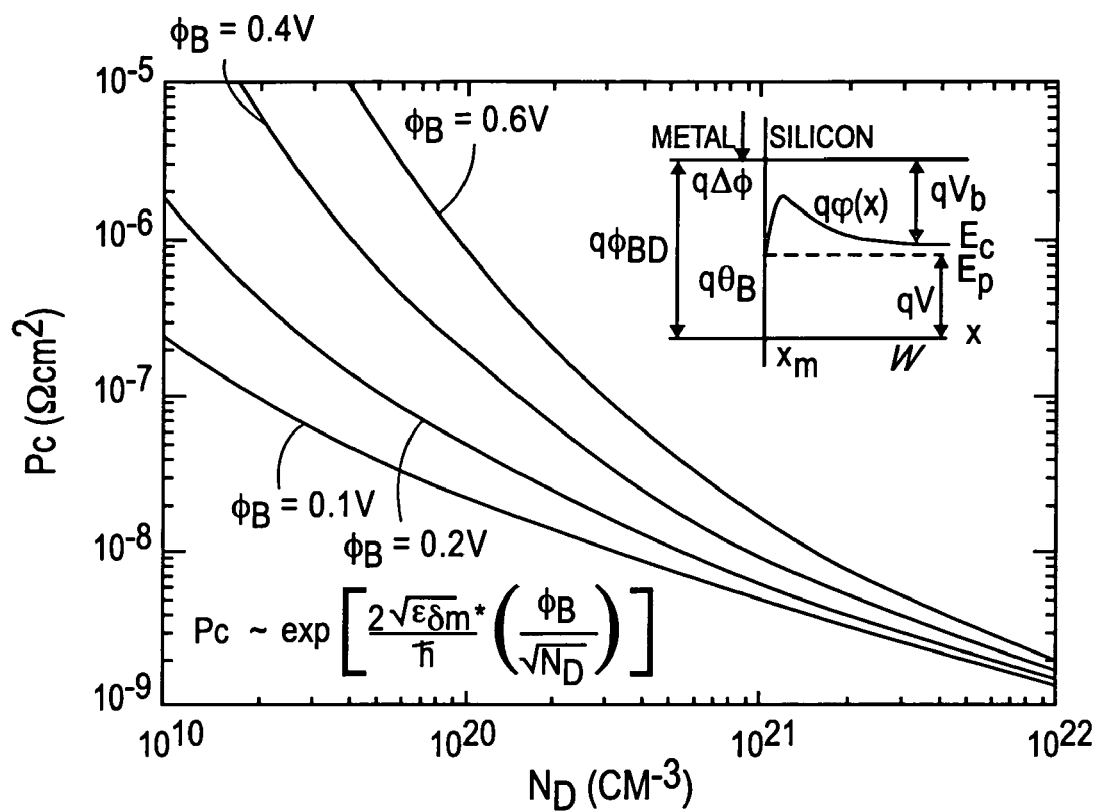
FIG. 1 shows a quantitative relationship between contact resistivity, $\rho_c$, and the active dopant concentration or electron density for various values of the effective barrier height at a metal-semiconductor interface.

In general, there are two primary factors that determine the interface resistance at a metal-semiconductor interface: the active dopant concentration or electron concentration and the effective tunnel barrier height, $\Phi_b$. FIG. 1 shows the quantitative relationship between the contact resistivity, $\rho_c$, and the active dopant concentration or electron density, for various values of the effective barrier height at the interface. In a silicon NMOS transistor with a nickel silicide (NiSi) contact where the barrier height is approximately 0.6 electron volts (eV) and the dopant concentration for n+ doped source and drain junction regions at the interface is $5 \times 10^{20}$ $cm^{-3}$, the contact resistivity is $8 \times 10^{-8}$ $\Omega cm^2$. Lowering the barrier height by selecting a lower work function metal to form the ohmic contact is an option, however, Fermi level pinning in the middle of the silicon energy band gap invariably leads to a higher effective barrier height, regardless of the work function of the metal.

In an embodiment that follows, a junction region silicide is replaced with a pinning layer that, for an NMOS transistor device, tends to exhibit large electron accumulation on a surface due to the pinning of the surface Fermi level well above the conduction band edge. Indium nitride and indium-rich-group III-nitride compounds exhibit this property. Substituting a pinning layer with this property tends to result in the lowering of the effective tunnel barrier height for electrons, resulting in lower specific contact resistivity and reduced interface resistance for NMOS transistors.

Figure 2:
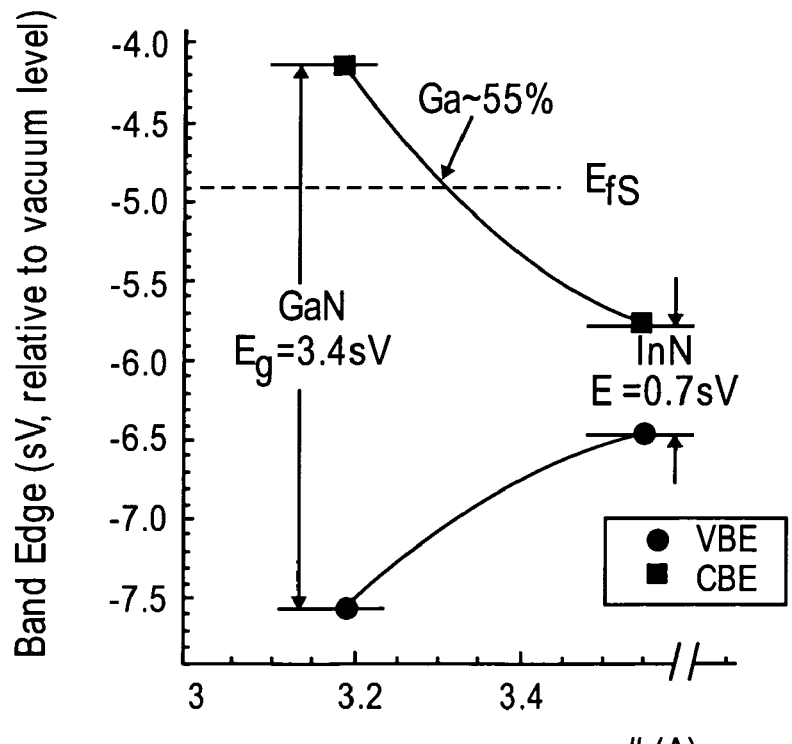
FIG. 2 shows the conduction band edge and valence band edge energies with respect to vacuum level in $In_xGa_{1-x}N$.
Figure 3:
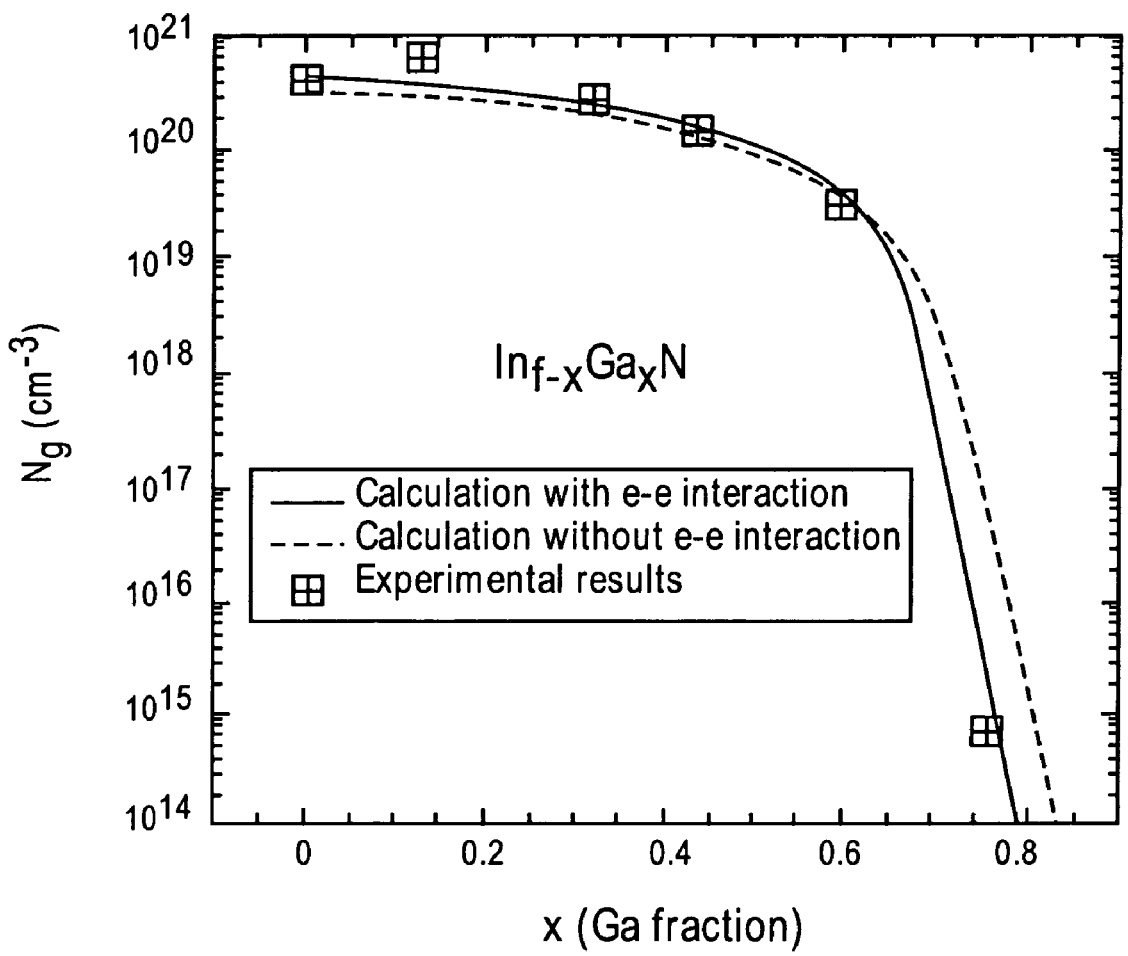
FIG. 3 shows surface electron concentration as a function of the alloy composition in $In_xGa_{1-x}N$ film.

FIG. 2 shows the conduction band edge (CBE) and valence band edge (VBE) energies with respect to the vacuum level in $In_xGa_{1-x}N$. FIG. 2 shows that due to the high electron affinity indium nitride (InN), the surface Fermi level, EFS, is relatively high into the conduction band which will result in an increased electron concentration at an interface surface (interface between the junction region and the pinning layer) and a lower barrier height. For $In_xGa_{1-x}N$ alloys, as the x decreases (more gallium), the CBE tends to move closer to the EFS and the surface electron concentration decays. This is illustrated in FIG. 3 which plots the surface electron concentration as a function of the alloy composition in In$_x$Ga$_{1-x}$N film.

Figure 4:
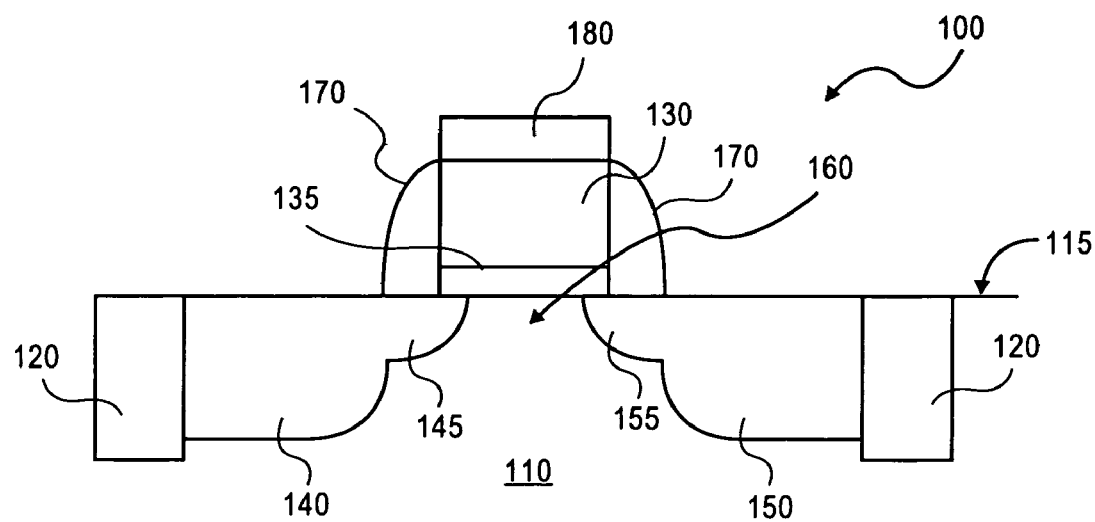
FIG. 4 shows a schematic, cross-sectional side view of a portion of a semiconductor substrate having an NMOS transistor device formed therein and thereon.

FIG. 4 shows a portion of a semiconductor substrate including a transistor device formed thereon/therein. Referring to FIG. 4, substrate 110 is a semiconductor substrate, such as silicon either as bulk silicon or a semiconductor (silicon) on insulated structure. In another embodiment, substrate 110 is a composite of different semiconductor materials, such as layers of silicon and silicon-germanium.

FIG. 4 shows trench isolation structure 120 formed in substrate 110. Trench isolation structure 120 defines an active area for a transistor device, in this case, transistor device 100. Trench isolation structure 120 may contain a dielectric material such as silicon dioxide (SiO$_2$) or other material.

Formed within an active area of substrate 110 defined by trench isolation structure 120 is transistor device 100. Transistor device 100 includes gate electrode 130 formed on surface 115 (upper surface as viewed) of substrate 110 and source junction region 140 and drain junction region 150 formed in substrate 110. Gate electrode 130 may be selected of a material such as silicon (e.g., polycrystalline silicon), a metal material, including a silicon alloy (e.g., silicide) material. Where gate electrode 130 is a silicon alloy such as a silicide material, to the extent that such gate electrode materials is formed by sequential deposition of a silicon material and a metal material, source junction region 140 and drain junction region 150 should be protected to minimize the deposition of any metal material into the respective junction region. Disposed between a surface of substrate 110 and gate electrode 130 is gate dielectric 135 of silicon dioxide or other dielectric material.

In one embodiment, transistor 100 is an NMOS transistor device with gate electrode 130, source junction region 140 and drain junction region 150 being n-type material (e.g., n-type doped silicon). An active area defined by trench isolation structure 120 in this embodiment includes a p-type well.

FIG. 4 shows side wall spacers 170 of, for example, a dielectric material formed on opposite sides of gate electrode 130. Source junction region 140 and drain junction region 150 are formed in substrate 110 in a manner that the junction regions are aligned to side wall spacers 170 on gate electrode 130. FIG. 4 also shows source tip region 145 and drain tip region 155 extending beneath gate electrode 130 in substrate 110. Channel 160 may be defined in substrate 110 as the area between source tip region 145 and drain tip region 155.

Overlying a surface of gate electrode 130 (a top surface as viewed) in the device structure illustrated in FIG. 4 is hard mask layer 180. Hard mask layer 180 is a material such as silicon nitride intended to protect gate electrode 130 from a subsequent deposition process. Hard mask layer 180 of silicon nitride may be deposited to a thickness on the order of 500 angstroms (Å) to 2000 Å.

Figure 5:
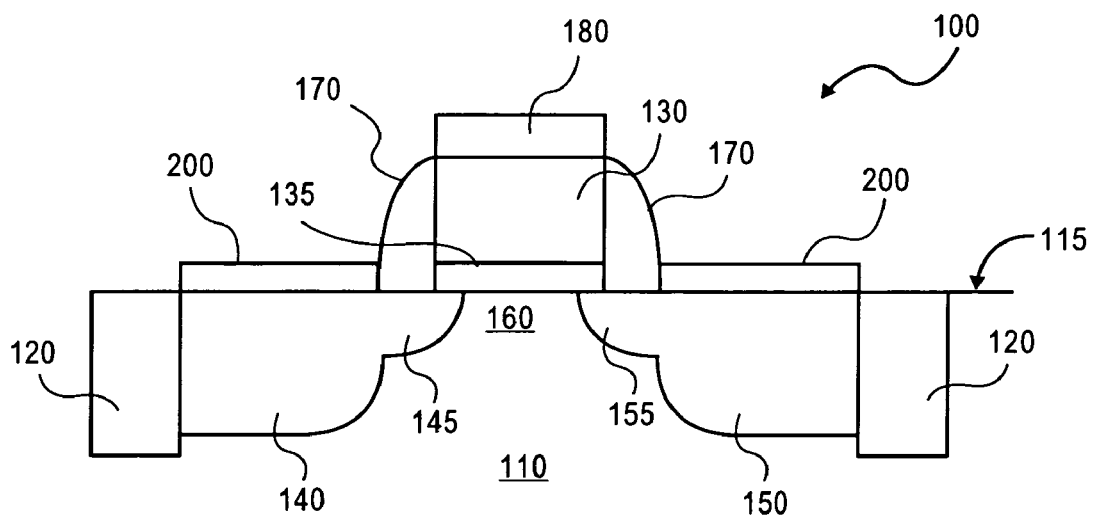
FIG. 5 shows the structure of FIG. 4 following the introduction of a pinning layer on a source junction region and a drain junction region of the transistor.

FIG. 5 shows the structure of FIG. 4 following the deposition of pinning layer 200 over source junction region 140 and drain junction region 150. In one embodiment, pinning layer 200 is a material selected for an NMOS device to have a Fermi level at or above the conduction band edge. One suitable material is n-doped indium nitride (InN) that tends to exhibit large electron accumulation at the interface of pinning layer 200 and source junction region 140 and drain junction region 150 due to the pinning of a surface Fermi level well above the conduction band edge. Another suitable material is an indium-rich-group III-nitride compound having the general formula:

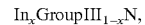

where x is greater than 0.5. One suitable Group III material is gallium. In an embodiment where the Group III material is gallium, x is between 0.6 and 1.

FIG. 5 shows pinning layer 200 disposed on surface 115 of substrate 110 over source junction region 140 and drain junction region 150. In one embodiment, pinning layer is an epitaxial layer deposited to a thickness on the order of one nanometer to ten nanometers. Suitable deposition techniques include molecular beam epitaxy or metal organic chemical vapor deposition.

Figure 6:
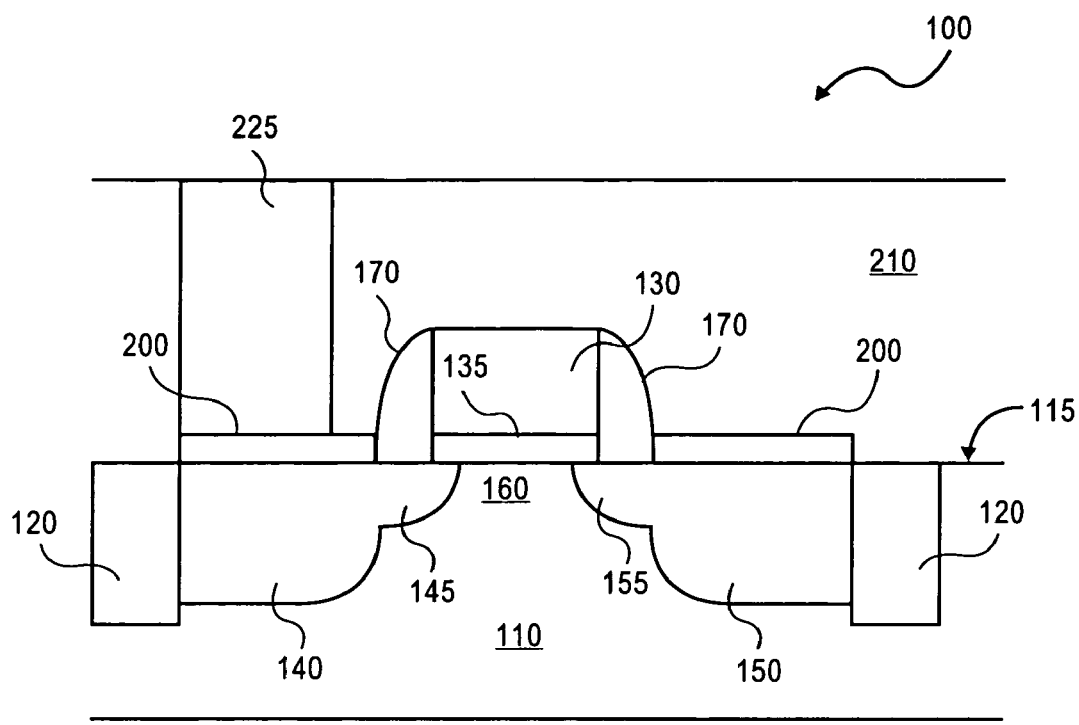
FIG. 6 shows the structure of FIG. 5 following the isolation of the transistor device and formation of a contact to the source junction region.

FIG. 6 shows the structure of FIG. 5 following the removal of hard mask layer 180 and the formation of a contact to source junction region 140. Referring to FIG. 6, hard mask layer 180 may be removed by an etching process (e.g., chemical etch). Following the removal of hard mask layer 180, a dielectric material may be deposited as a pre-metal dielectric layer or interlayer dielectric layer (ILD0). Dielectric layer 210 is, for example, a silicon dioxide material or a dielectric material having a dielectric constant less than silicon dioxide. Dielectric layer 210 is deposited such as by chemical vapor deposition to a desired thickness that encapsulates transistor device 100.

Following the deposition of dielectric layer 210, a contact opening may be formed to each of source junction region 140, drain junction region 150 and gate electrode 130. The contact openings may be made by using photolithography and etching techniques to expose pinning layer 200 over source junction region 140 and drain junction region 150 and a surface of gate electrode 130. FIG. 6 shows a conductive material such as tungsten formed through dielectric layer 210 to pinning layer 200 over source junction region 140. In one embodiment, conductive material 225 is a tungsten material. Similar contacts may be formed to pinning layer 200 over drain junction region 150 and gate electrode 130. In this cross-section, only the contact to source junction region 140 is shown.

Figure 7:
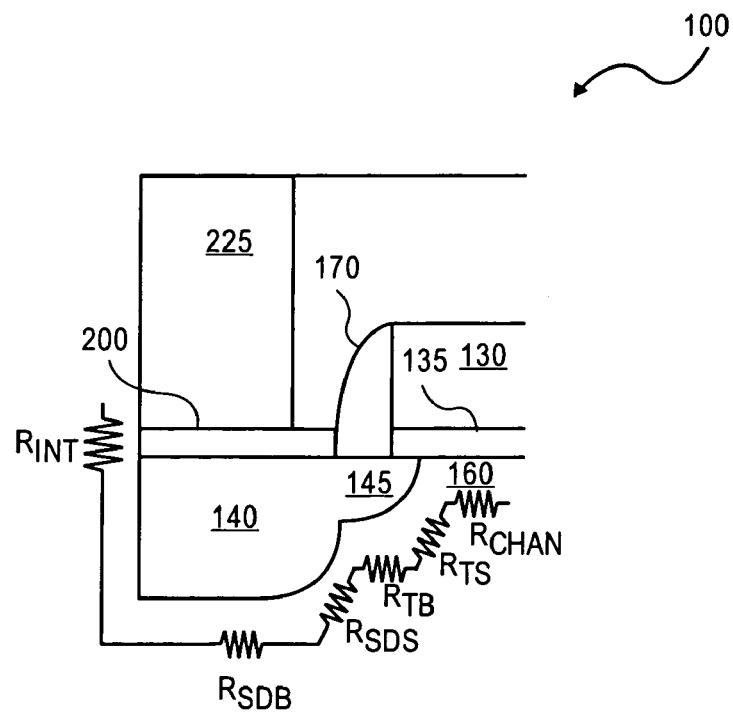
FIG. 7 shows a magnified view of the structure of FIG. 6 and schematically illustrates the series resistance components of the device.

FIG. 7 shows a magnified view of a portion of transistor 100 shown in FIG. 6. FIG. 7 shows the various components of the parasitic series resistance of the transistor represented as:

R$_{SDB}$ is source drain bulk resistance;
R$_{SDS}$ is source drain spreading resistance;
R$_{TB}$ is tip bulk resistance;
R$_{TS}$ is tip spreading resistance;
R$_{CHAN}$ is channel resistance; and
R$_{INT}$ is pinning layer source junction resistance.

By using pinning layer 200 of an indium nitride material or an indium-rich-group III-nitride material, the interface resistance R$_{INT}$ may be reduced compared to a similar resistance where a silicide layer is used in the prior art.

In the preceding detailed description, reference is made to specific embodiments thereof. It will, however, be evident that various modifications and changes may be made thereto without departing from the broader spirit and scope of the following claims. The specification and drawings are, accordingly, to be regarded illustrative rather than a restrictive sense.

What is claimed is:
1. An apparatus comprising:
an N-type transistor structure including a gate electrode formed on a substrate and a source region and a drain region formed in the substrate;

a contact to the source region; and a pinning layer disposed between the source region and the contact and defining an interface between the pinning layer and the source region, wherein the pinning layer comprises indium nitride or an indium-group III-nitride having donor-type surface states in a conduction band.

2. The apparatus of claim 1, wherein the pinning layer comprises indium nitride.

3. The apparatus of claim 1, wherein the pinning layer comprises indium-group III-nitride.

4. The apparatus of claim 1, wherein the pinning layer comprises indium-gallium nitride.

5. The apparatus of claim 1, wherein the pinning layer comprises $In_xGa_{1-x}N$, wherein x is between 0.6 and 1.

6. The apparatus of claim 1, wherein the pinning layer comprises an epitaxial layer.

7. A method comprising: forming a transistor structure comprising a gate electrode on a substrate and a source region and a drain region formed in the substrate; depositing a pinning layer comprising indium nitride or an indium-group III-nitride having donor-type surface states on the source region and the drain region such that an interface is defined between the pinning layer and the respective one of the source region and the drain region; and forming a first contact to the source region and a second contact to the drain region.

8. The method of claim 7, wherein prior to depositing the pinning layer, the method comprises masking the gate electrode with a material to inhibit depositing a material for the pinning layer on the gate electrode.

9. The method of claim 7, wherein a material for the pinning layer comprises indium nitride.

10. The method of claim 9, wherein depositing comprises depositing by a molecular beam epitaxy method or a metal organic chemical vapor deposition method.

11. The method of claim 7, wherein the pinning layer comprises indium-gallium nitride.

12. The method of claim 7, wherein the pinning layer comprises $In_xGa_{1-x}N$, wherein x is between 0.6 and 1.

13. A system comprising:

a computing device comprising a microprocessor, the microprocessor coupled to a printed circuit board through a substrate, the microprocessor comprising a plurality of N-type transistor devices each including:

a gate electrode formed on a substrate and a source region and a drain region formed in the substrate;

a first contact to the source region and a second contact to the drain region;

a first pinning layer disposed between the source region and the first contact and defining an interface between the first pinning layer and the source region; and a second pinning layer disposed between the drain region and the second contact and defining an interface between the second pinning layer and the drain region, wherein each of the first pinning layer and the second pinning layer comprises indium nitride or an indium-group III-nitride donor-type surface states in a conduction band.

14. The system of claim 13, wherein the first pinning layer and the second pinning layer each comprise indium nitride.

15. The system of claim 13, wherein the first pinning layer and the second pinning layer each comprise indium-group III-nitride.

16. The system of claim 13, wherein the first pinning layer and the second pinning layer each comprise indium-gallium nitride.

17. The system of claim 13, wherein the first pinning layer and the second pinning layer each comprise $In_xGa_{1-x}N$, wherein x is between 0.6 and 1.

18. The system of claim 13, wherein the first pinning layer and the second pinning layer each comprise an epitaxial layer.

* * * * *